United States Patent
Roberts

(10) Patent No.: US 6,453,157 B1
(45) Date of Patent: Sep. 17, 2002

(54) RADIO FREQUENCY TRACKING FILTER

(75) Inventor: Gerald E. Roberts, Lynchburg, VA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/045,701

(22) Filed: Mar. 23, 1998

(51) Int. Cl.[7] .................................................. H04B 1/16
(52) U.S. Cl. ...................... 455/337; 455/302; 455/307; 455/340; 333/176
(58) Field of Search .......................... 455/339, 78, 302, 455/303, 304–307, 340, 318, 319, 334–338; 333/202–208, 29 C, 167–180

(56) References Cited

U.S. PATENT DOCUMENTS

| | | | | |
|---|---|---|---|---|
| 3,882,434 A | * | 5/1975 | Levy | 333/212 |
| 4,287,602 A | * | 9/1981 | Kessler | 455/286 |
| 4,316,108 A | | 2/1982 | Rogers, Jr. | 327/553 |
| 4,338,571 A | * | 7/1982 | Young | 330/84 |
| 4,518,935 A | * | 5/1985 | Van Roermund | 333/173 |
| 4,714,906 A | | 12/1987 | D'Albaret et al. | 333/207 |
| 5,060,297 A | | 10/1991 | Ma et al. | 455/302 |
| 5,065,120 A | * | 11/1991 | Munn | 333/207 |
| 5,227,748 A | | 7/1993 | Sroka | 333/202 |
| 5,495,215 A | | 2/1996 | Newell et al. | 327/553 |
| 5,774,555 A | * | 6/1998 | Lee et al. | 381/4 |
| 6,011,959 A | * | 1/2000 | Reeser et al. | 455/76 |

OTHER PUBLICATIONS

Mole, J.H. "Filter Design Data for Communication Engineers" 1952; John Wiley & Sons, New York pp. 55–56.*
Perry et al "The Design of Log–Domain Filters Based on the Operational Simulation of LC Ladders" IEEE 1057–7130 11/96 pp. 763–773.*
Kim et al "A Modified Elliptic Function with Diminishing Ripples" IEEE 7803–2428 5/95 pp. 1027–1031.*
Fischerauer et al "IF and RF filters for mobile telephone systems" IEEE Ultrasonics Symposium, 1991 pp. 235–239, Dec. 1991.*
Razavi, Behzad RF Microelectronics, 1998 CH 5 "Transceiver Architectures", pp. 122–128, Jan. 1998.*

(List continued on next page.)

*Primary Examiner*—Dwayne Bost
*Assistant Examiner*—Charles Craver
(74) *Attorney, Agent, or Firm*—Nixon & Vanderhye P.C.

(57) ABSTRACT

A passive bandpass tracking filter tracks the frequency of an RF input signal received within a radio receiver's tracking range of RF frequencies. The bandpass filter includes parallel inductor and capacitor circuits connected in shunt between the input and output filter ports. A tracking control signal is selectively applied to change the capacitance of the LC circuits in order to shift the filter's frequency characteristics/profile as the filter tracks through the tracking band. The filter attenuates half-IF, receiver IF, and image spurious signals. In particular, the filter substantially attenuates the image spurious signal throughout the tracking frequency range by 50 dB or more below the filter output signal level. The filter also attenuates the half-IF spurious signal throughout the tracking frequency range by well over 10 dB or more below the filter output signal level. The receiver IF spurious signal is attenuated about 40 dB. The bandpass tracking filter has both a low insertion loss of about 5.0 dB or less and a substantially constant insertion loss variance at the RF receive frequency of about 1 dB or less over the entire tracking frequency range.

29 Claims, 5 Drawing Sheets

OTHER PUBLICATIONS

DeVerl S. Humphreys, "The Analysis, Design, and Synthesis of Electrical Filters," Dept. of Electrical Engineering, Brigham Young University, Prentice–Hall, Inc., Englewood Cliffs, N.J., 1970, pp. 15–17.

Arthur B. Williams and Fred J. Taylor, "Electronic Filter Design Handbook," $3^{rd}$ edition, McGraw–Hill, Inc., New York, 1995, pp. 1.7–1.8, 2.37, 2.74–2.75, 5.15, and 5.38.

SAMS, "Reference Data for Engineers: Radio, Electronics, Computer, and Communications," Eighth Edition, A Revision of Reference Data for Radio Engineers, Prentice Hall Computer Publishing, Carmel, Indiana, pp. 10–3–10–35.

*IEEE & CRC Press*, Wai–Kai Chen, Editor–in–Chief, University of Illinois, Chicago, Illinois, "The Circuits and Filters Handbook", 1995, pp. 371–398, 2491–2492, 2502 2511 & 2519–2520.

David M. Pozar, "Microwave Engineering," University of Massachusetts at Amherst, Addison–Wesley Publishing Company, Reading, Massachusetts, 1990, p. 1.

David M. Pozar, "Microwave Engineering," University of Massachusetts at Amherst, Addison–Wesley Publishing Company, Reading, Massachusetts, 1990, p. 1.

Communications Receivers, Principles and Designs, Ulrich L. Rhode and T.T.N. Bucher, McGraw–Hill Book Company, 1988, pp. 160–164.

Ericsson Maintenance Manual, Prism HP/LPE–200, Scan and System Portable Radios, 800 MHz, Aug. 1997, pp. 4–18 and 38–39.

Motorola Detailed Service Manual, 68P81076C10–0, Nov. 1994, Table of Contents, pp. 1–23, 101, and 106.

* cited by examiner

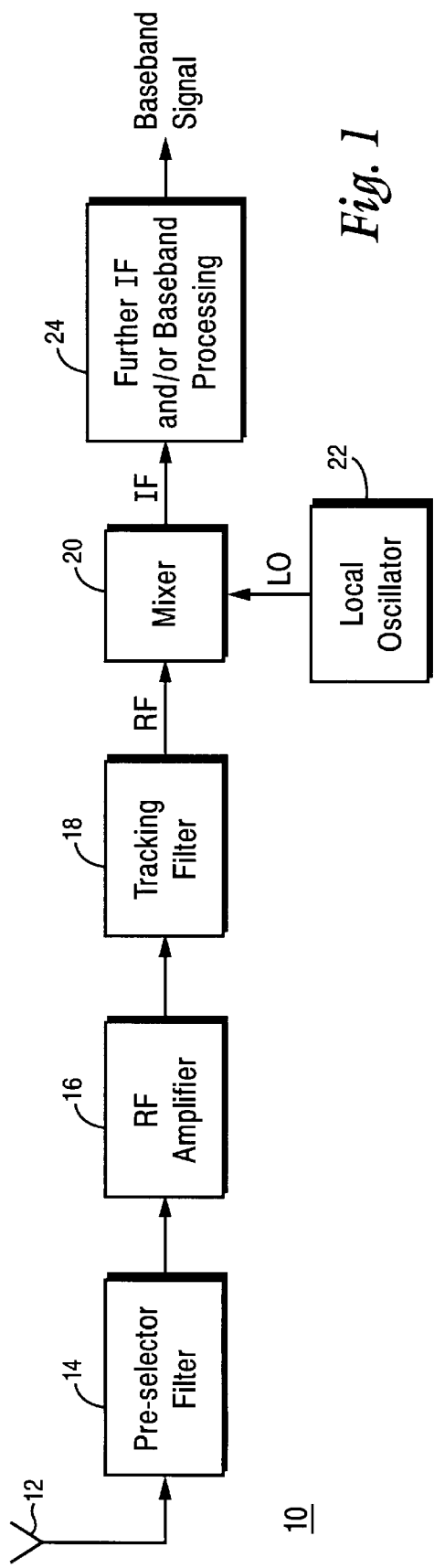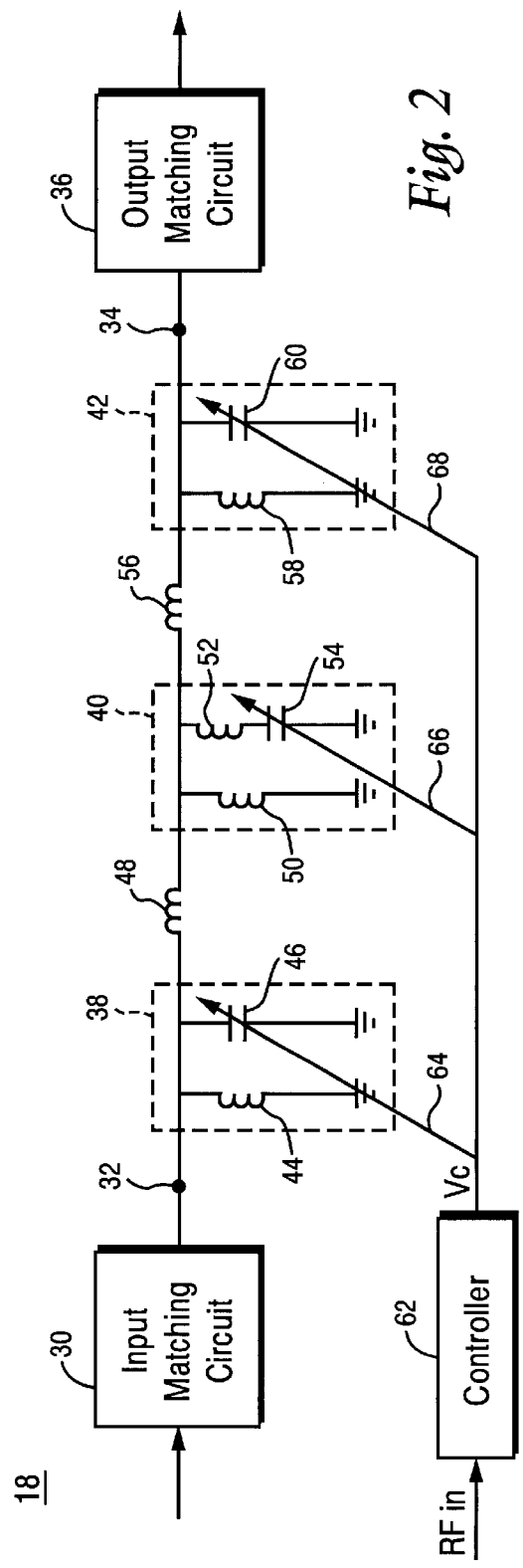

RADIO FREQUENCY TRACKING FILTER

FIELD OF THE INVENTION

The present invention generally relates to filters, and in particular, to a tracking filter that tracks received signals over a relatively wide radio frequency (RF) band.

BACKGROUND AND SUMMARY OF THE INVENTION

Electrical wave filters are used in communication systems to control, distinguish and/or separate certain frequency bands of an electrical signal from other signals in neighboring frequency bands. A filter is typically placed between two terminal pairs or two ports of an electrical circuit in order to modify the frequency components of a signal. Ideally, a filter will allow a certain band or bands of frequencies of a signal to pass through it with little or no attenuation. These are called the passbands of the filter. Other bands of the same signal are substantially attenuated. These bands are called the stopband or stopbands of the filter. Filters can be classified as to the range of frequencies that are passed and those that are attenuated. The more common classifications of filters are lowpass, highpass, bandpass, and bandstop filters. The present invention pertains particularly to a bandpass filter whose passband is in the radio frequency range and whose passband can be shifted in frequency electronically.

In the practical case, the band of frequencies separating a passband from its adjacent stopband or stopbands is called a transition band. The cutoff frequency of a filter defines the passband limit and usually corresponds to a frequency that is 3 dB down from the passband transmission maximum. Lowpass and highpass filters have only one cutoff frequency, while bandpass and bandstop filters have two cutoff frequencies.

If the frequency components of a signal falling within the passband of an ideal filter are applied to the input of the filter, they are "passed" by the filter without attenuation to the output of the filter. Those frequency components in the stopband of the ideal filter are suppressed, and the transition band or bands have zero width. However, the amplitude of the frequency components falling within the passband frequency range of a practical RF bandpass filter may experience attenuation due to circuit absorption, reflections, radiation, and the "roll-off" to the 3 dB cutoff frequencies at the passband edges. All of these contributions to signal attenuation result in power loss of the signal passed to the output of the filter.

A filter attenuation or insertion loss function $A(\omega)$ may be defined as the decrease in power delivered to the load when a filter network is inserted between the source and the load:

$$A(\omega) = 10 \log_{10} (|P_{max}|/|P_{out}|),$$

where $\omega$ is radian frequency $2\pi f$, $P_{max}$ is maximum power available to the load, and $P_{out}$ is the power delivered to the load when the filter is between the source and load. In general, the insertion loss at the minimum passband attenuation is often called "flat loss." The definition of insertion loss applies at any frequency and includes the attenuation due to the filter's selectivity.

Two major problems with tracking filters include a large value of flat loss or substantial changes to the filter's flat loss over the tracking range or both. For example, a large value of flat loss for an RF receiver tracking filter causes the desired received RF signal to be substantially attenuated regardless of where it falls in the bandpass and adversely affects the gain distribution, the sensitivity, and the noise figure of the receiver. The change in flat loss of the RF tracking filter (and therefore the change in the passband insertion loss) over the tracking range causes another problem in the distribution and control of gain through the receiver which changes the filter's noise figure over the tracking range. This latter problem makes certain receive bands more noisy and less desirable than other receive bands. Variation in the flat loss of the tracking filter and/or the variation in the passband insertion loss of the tracking filter over the tracking range may cause a decrease in receiver sensitivity when the passband of the tracking filter is in one position as compared to another position in the RF tracking range.

Most radio receivers are of the superheterodyne or double superheterodyne type in which the incoming RF signal is fed to a mixer and mixed with a locally-generated signal from a local oscillator. The mixer output includes an intermediate frequency (IF) signal equal to the difference between the locally-generated signal and the received RF frequency but still containing all of the original modulation. Stable high gain amplification and greater selectivity are directly attributable to the use of the intermediate frequency.

Many receivers employ "high-side injection" because the required voltage-controlled oscillator (VCO) tuning range for the synthesizer providing local oscillator frequency for the first mixer in the receiver chain is smaller (percentage-wise) for high-side injection than for low-side injection. When high-side injection is used, the problem is to design a bandpass-tracking filter of small size using practical passive element (i.e., inductors and capacitor) values. A passive filter requires no power for signal passband gain, but a control voltage may be used to change the position of the filter passband. Also, the passband of the tracking filter should have a low insertion loss and a relatively constant insertion loss as it is shifted in frequency over a relatively wide tracking range which can encompass the entire RF receive passband of the radio. In addition, the filter should have substantial attenuation on the high side of the passband.

Typically, achieving small size is associated with the simplicity of the filter (i.e., the order of the filter). On the other hand, substantial attenuation on the high side of the passband is associated with more filter complexity. Added complexity is especially a problem in achieving substantial attenuation on the high side of passband of the filter close enough to the passband to attenuate three of the most potentially troublesome and unwanted signals which may be received by the radio at $f_{RF}+(\frac{1}{2})f_{if}$, $f_{RF}+f_{if}$, and $f_{RF}+2f_{if}$, commonly called the half-IF, the IF, and the image spurious signals, respectively. These unwanted RF signals may be produced directly (in varying degrees) in the IF band in the IF section of the receiver due to mixer nonlinearity, straight IF frequency pickup, and normal mixer action, respectively. If the RF tracking band to be covered is wide, then one or all of these unwanted signals may fall within this RF tracking band when the desired RF signal is received at the lower frequency portion of the RF tracking band. Therefore, a fixed passive RF filter with a passband corresponding to the width of the RF tracking band cannot be used because the unwanted signals would not be attenuated. However, if a narrower filter is used, then a desired RF signal received in the upper section of the RF tracking band would be attenuated. A tracking filter is needed to pass the desired RF signal received on the lower frequency section of the RF tracking band while still attenuating three spurious signals described above, one or all of which may occur within the overall RF tracking band.

One possible solution to deal with such image frequencies is to employ several passive filters, such as surface acoustic wave (SAW) filters, having different center frequencies and, using switches, select one of several filters based on the received signal frequency. The drawback with this solution is that multiple filters and switches corresponding increase the cost, complexity, and size of the radio receiver. Therefore, what is needed is a single passive bandpass filter (small size and low complexity) that can be manufactured inexpensively using realistic element values which (1) can be easily controlled to operate over a relatively wide RF tracking band, (2) has relatively low and constant insertion loss over that RF tracking band, (3) substantially attenuates undesirable frequencies on the high side of the pass band, and (4) attenuates unwanted spurious signals received inside the tracking band.

It is an object of the present invention to overcome the drawbacks and meet the needs described above by providing a single, passive bandpass filter whose passband can be shifted over a relatively wide RF tracking band while at the same time significantly attenuating undesirable spurious signals both within and outside the RF tracking band.

It is a further object of the present invention to provide a passive RF bandpass tracking filter having relatively low insertion loss of about 5.0 db or less across the RF tracking band.

It is a further object of the present invention to provide a passive RF bandpass tracking filter having a substantially constant insertion loss across the RF tracking frequency range with a variance of 1 db or less.

It is a further object of the present invention to provide a passive RF bandpass tracking filter in which both the center frequency of the filter pass band and a high side finite attenuation pole of the filter can be shifted together as the filter tracks the input RF signal.

It is a further object of the present invention to provide a passive RF tracking filter which uses standard inductor and capacitor element values and is relatively simple, low cost, and small in size.

It is yet another object of the present invention to provide a passive RF tracking filter which achieves low intermodulation (IM) distortion despite its wide RF tracking band.

The present invention provides a passive bandpass tracking filter that tracks the frequency of an RF input signal received within a radio receiver's tracking range of RF frequencies. The bandpass filter includes parallel inductor and capacitor (LC) circuits connected in shunt between input and output terminals of the filter. A tracking control voltage is selectively applied to change the capacitance of the LC circuits in order to shift the filter's frequency characteristic/profile as the filter tracks through the tracking band. The control signal can be selectively applied to the capacitors in the LC circuits to change the capacitance in all of the LC circuits by the same amount or by different amounts depending upon the application. The filter frequency profile includes both a center frequency of the pass band of the filter as well as a high side, finite attenuator pole of the filter which defines the frequency at maximum attenuation. Both the center frequency and finite attenuation pole shift as the filter tracks an incoming RF signal. In the example embodiment, the tracking frequency range is about 403 MHz to 470 MHz.

Half-IF, receiver IF, and image spurious signals are all attenuated. The filter substantially attenuates the image spurious signal throughout the tracking frequency range by over 50 db or more below the filter output signal level. The filter also attenuates the half-IF spurious signal throughout the tracking frequency range by well over 10 dB below the filter output signal level. The receiver IF spurious signal is attenuated about 40 dB. The bandpass tracking filter has both a low insertion loss of 5.0 dB or less and a substantially constant insertion loss variance at the RF receive frequency of about 1 dB or less over the entire tracking frequency range.

These and other objects, advantages, and features of the present invention will be described in further detail below in conjunction with the drawings.

BRIEF DESCRIPTION OF THE DRAWINGS

FIG. 1 is a function block diagram of an example radio receiver in which the present invention may be employed;

FIG. 2 is a generalized circuit diagram illustrating a tracking filter in accordance with a preferred example embodiment of the present invention;

DETAILED DESCRIPTION OF THE DRAWINGS

Figure 3:
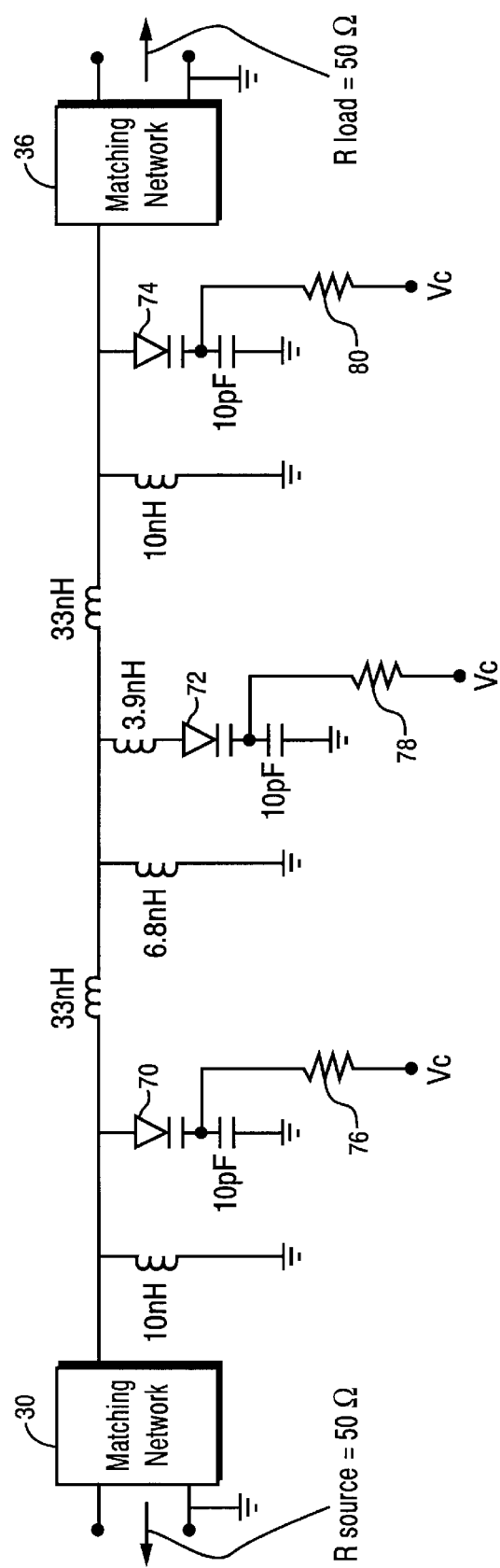
FIG. 3 is a more detailed schematic of an example embodiment of a tracking filter in accordance with the present invention providing one set of example passive element values.

In the following description, for purposes of explanation and not limitation, specific details are set forth, such as particular embodiments, circuits, circuit components, etc. in order to provide a thorough understanding of the present invention. However, it will be apparent to one skilled in the art that the present invention may be practiced in other embodiments that depart from these specific details. In other instances, detailed descriptions of well-known methods, devices, circuits, and circuit components are omitted so as not to obscure the description of the present invention with unnecessary detail.

FIG. 1 shows a function block diagram of a radio receiver 10 in which the present invention may be advantageously implemented. An RF signal is received at an antenna 12 and filtered in a preselector low pass filter 14 to remove spurious high frequency signals and improve the selectivity of the receiver. The filtered signal is amplified in an RF amplifier 16 and then filtered in the tracking filter 18 to attenuate, among other things, various unwanted receiver spurious signals as will be described in more detail in the example embodiment disclosed below. A local oscillator (LO) 22 provides a range of local oscillator signals to a mixer 20. The mixer 20 mixes the filtered RF signal from the tracking filter 18 and the LO signal to generate an intermediate frequency (IF) signal which contains the modulated information but at a lower frequency. The IF signal is further processed in block 24 to produce a baseband signal that may, for example, be used to drive a speaker if the baseband signal contains audio information. Although only one IF stage is shown in FIG. 1, a second IF stage may be desired in order to make use of existing components and integrated circuits readily available at low cost.

The radio receiver 10 in FIG. 1 may be incorporated, for example, into a UHF radio that receives RF signals over the relatively wide RF band of 403–470 MHz. Accordingly, RF signals are input to the mixer 20 in the range of 403–470 MHz. A relatively high IF frequency is employed at 125.25 MHz. Since high side injection is used, the local oscillator 22 generates LO signals for input to the mixer 20 in the range of 528.25–595.25 MHz depending on the detected RF input signal frequency. The desired IF output of the mixer 20 therefore corresponds to the difference of the LO signal and input RF signal from tracking filter 18. If a second IF stage is employed, the second IF frequency may be for example 450 kHz.

With the IF frequency at 125.25 MHz, the mixer 20 also produces undesirable mixer products at various image frequencies linked to that IF frequency of 125.25 MHz. The image is produced at the RF input signal plus twice the IF. Thus, if the received RF signal is at 403 MHz, an image spurious signal is produced at 653.5 MHz (403+2×125.25). The tracking filter 18 strongly attenuates this image spurious signal 50 db or more below the filter output signal.

Because the receiver band from 403 to 470 MHz is relatively wide, an unwanted receiver spurious signal can unfortunately be produced within the tracking band of the filter 18. Specifically, this unwanted receiver spurious signal corresponds to the RF input signal plus one-half of the IF and is known as half-IF spurious signal. Continuing with the example of an RF signal received at 403 MHz, a half-IF spurious signal is produced at 456.25 MHz (403+½×125.25) which falls within the tracking band of 403–470 MHz. Attenuation of the half-IF spurious signal is therefore particularly challenging, especially when it may be necessary or otherwise desirable to attenuate such a half-IF spurious signal within the tracking band by 10 db or more below the filter output level.

Rather than switching between multiple filters, e.g., SAW filters, at various center frequencies strategically spaced over the tracking band to avoid the undesirable image frequencies, the present invention provides a single, inexpensive, but nevertheless very effective passive filter that provides the necessary attenuation at the in-band and out-of-band unwanted receiver spurious signals with relatively low and constant insertion loss across the tracking band. An example embodiment of such a tracking filter 18 is illustrated in FIG. 2.

An input matching circuit 30 receives an RF input signal and generates an output connected to a filter input terminal 32. Filter output terminal 34 is connected to an output matching 36 whose output is connected to the mixer 20. Three LC circuits 38, 40, and 42 indicated by dashed lines are interconnected by series inductors 48 (between LC circuits 38 and 40) and 56 (between LC circuits 40 and 42). Each parallel LC circuit 38, 40, and 42 is connected in shunt between the input terminal 32 and output terminal 34. LC circuit 48 includes inductor 44 and variable capacitor 46; LC circuit 40 includes parallel inductor 50 and variable capacitor 54 with an additional inductor 52 connected in series with variable capacitor 54; and LC circuit 42 includes inductor 58 and variable capacitor 60.

A controller 62 provides control signals 64, 66, and 68 to vary the capacitance of capacitors 46, 54, and 60 in accordance with the tracked RF frequency received by antenna 12. For example, controller 62 receives a signal corresponding to the currently received RF input signal and determines the center frequency of the currently received signal somewhere within the tracking band of 403 to 470 MHz. Based upon the detected frequency of the input signal, the controller 62 generates a control signal $V_c$ which changes the capacitance value of the LC circuits. By changing the capacitance values of the LC circuits an appropriate amount, the controller 62 shifts the frequency response of the tracking filter so that the center frequency of the pass band is at or near the received RF frequency. Depending upon the design application, the controller may apply the same control signal $V_c$ to each of the three capacitors or, in some applications, may apply the same control voltage to capacitors 46 and 60 with a somewhat different control voltage to capacitor 54.

Although somewhat oversimplified, it is helpful for purposes of understanding the operation of the tracking filter 18, to view the LC circuits 38 and 42 as being controlled together to shift the filter pass band in accordance with the frequency of the currently received signal. The LC circuit 40 is controlled to move the finite attenuation pole at the high side of the filter frequency profile/characteristic also in accordance with the frequency of the currently received signal. If similar or the same control voltages are applied to the capacitors in all three of the LC circuits 38, 40, and 42, the center frequency of the pass band as well as the high side finite attenuation pole are shifted together in accordance with the frequency of the currently received signal. On the other hand, the control voltage applied to LC circuit 40 may be such that the high side finite attenuation pole remains relatively stationary while the center frequency of the filter pass band is moved thereby changing the slope of the filter "skirt" on the high side of the pass band which may be desirable in certain applications.

FIG. 3 shows a somewhat more detailed schematic of one example, non-limiting implementation of the tracking filter 18. The variable capacitors are implemented using varactor diodes 70, 72, and 74. Thus, the selection of capacitor elements therefore must take into account each varactor diode is a part of the variable capacitance in each capacitor position. The capacitance changes are controlled by selectively applying a control voltage $V_c$ through respective resistors 76, 78, and 80 to the varactor diodes 70, 72, and 74, respectively. One commercially available varactor diode which may be used is a varactor diode model TOKO1410 manufactured and sold by Toko America, Inc. Sample values for the lumped L and C elements shown in FIG. 3 are indicated in the drawing for an example, lumped element implementation. However, a preferred implementation would employ microstrip lines and would take into account parasitic effects associated with a microstrip, PC board implementation at these RF frequencies. Those skilled in the art will recognize that these values are approximate only and depend on the particular circuit layout.

Figure 4:
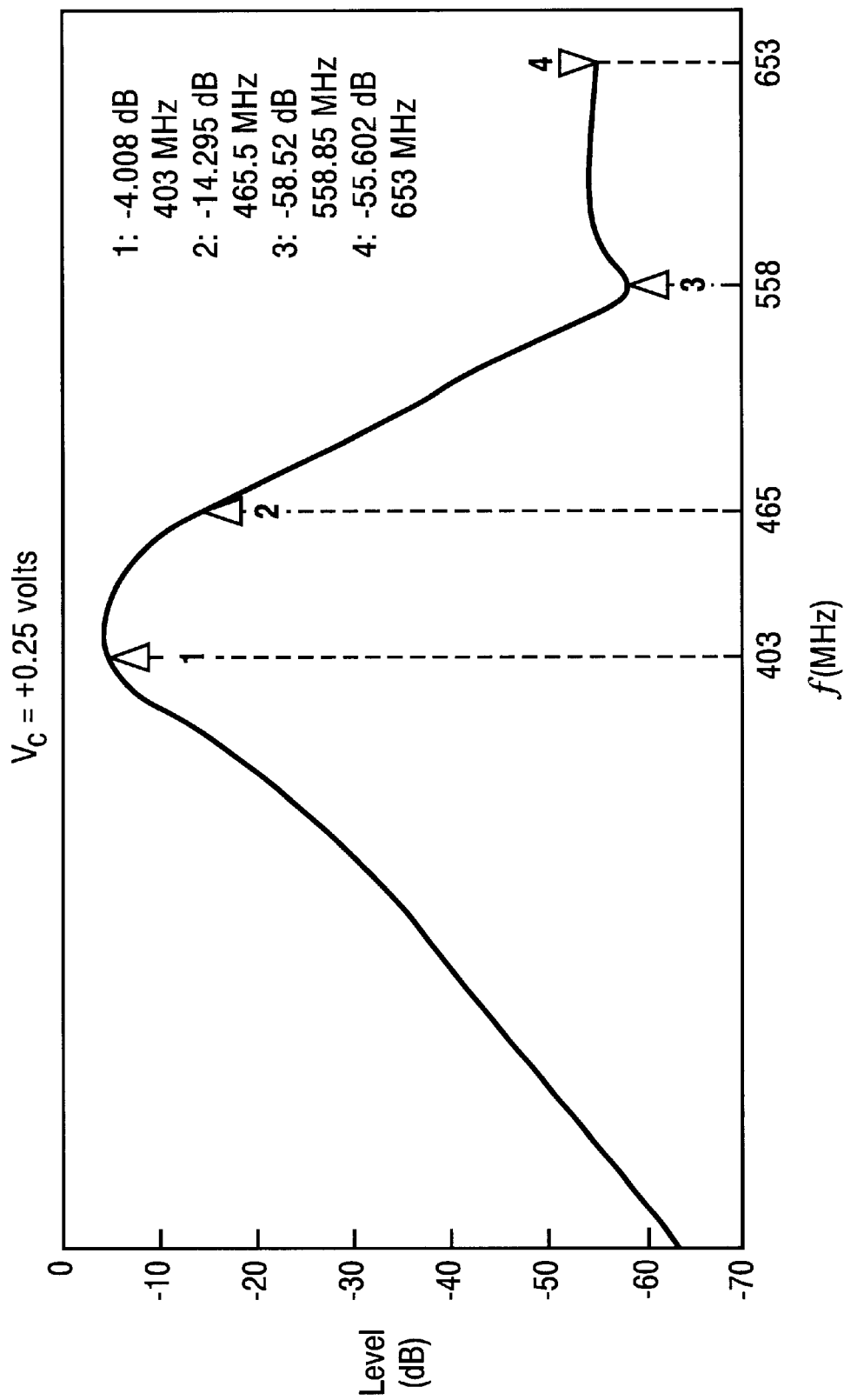
FIGS. 4–6 are frequency plots showing the frequency response of the filter of FIG. 3 for different control voltages $V_c$ over the RF tracking band of 403 MHz–470 MHz.
Figure 5:
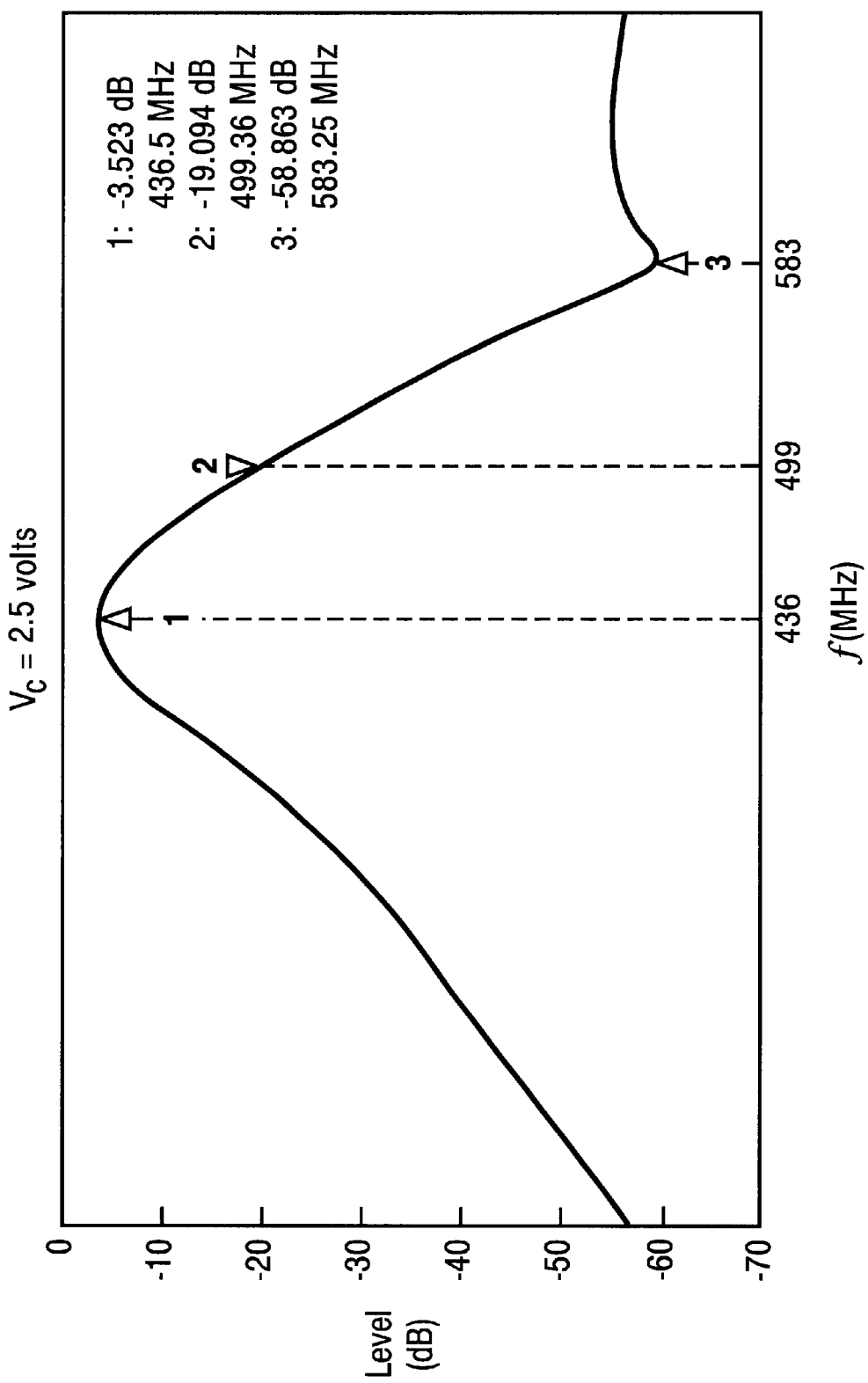
Figure 6:
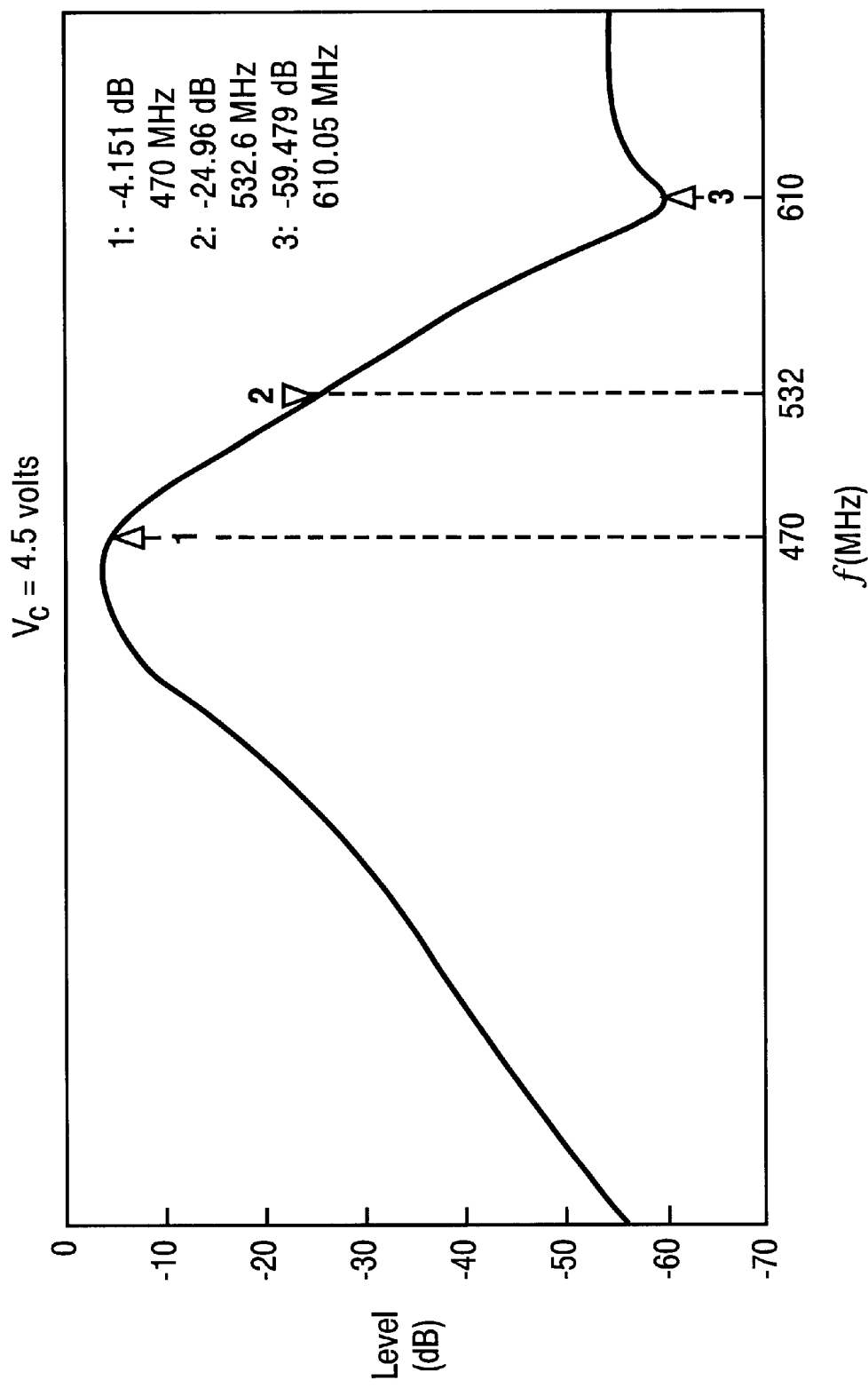

FIGS. 4–6 show example frequency responses (not to scale) of the tracking filter shown in FIG. 3 at different varactor control voltages. Specifically, FIG. 4 shows a frequency response of the filter at a control voltage $V_c$ of 0.25 volts. At this control voltage, the center frequency of the filter response shown at marker 1 is at 403 MHz at an attenuation of −4.008 db below the filter input signal level, i.e., 0 db. Accordingly, the insertion loss of the filter is quite low especially given the number of inductors employed. The half-IF spurious signal (marker 2) is at −465.5 MHz within the tracking band and is attenuated somewhat more than 10 db below the filter output signal level of −4.008 db at −14.295 db. The receiver IF spurious signal at 528.25 MHz is attenuated about 40 db below the filter output. The high side finite attenuation pole at pointer 3, corresponding to the maximum attenuation of the filter stop band corresponds to the finite loss pole at 558.5 MHz with an attenuation of −58.52 db, more than 50 db below the filter output signal level of −4008 db. The "return" portion of the stop band from 558.5 MHz includes the receiver image spurious signal which might occur at marker 4 at 653 MHz and which is attenuated to −55.602 db which again is also more than 50 db below the filter output signal level.

FIG. 5 shows the frequency characteristic of the filter in FIG. 3 with a control voltage $V_c$ equal to 2.5 volts applied to the varactors 70, 72, and 74. At that control voltage, the center frequency of the filter pass band corresponds to approximately 436.5 MHz as shown at marker 1 with an attenuation of −3.523 db. The half-IF spurious signal corresponds to marker 2 at approximately 499 MHz with an attenuation of −19.094 db over 15 db below the filter output signal level. The receiver IF spurious signal at 561.75 MHz is attenuated about 40 dB below the filter output. Marker 3 indicates the finite attenuation pole at 583.25 MHz with an attenuation of −58.863 dB. The return, including the position where the unwanted image spurious signal (not shown) would occur, is about 50 dB below the filter output signal band.

FIG. 6 shows the frequency response of the tracking filter in FIG. 3 when a control voltage $V_c$ equal to 4.5 volts is applied to the varactors 70, 72, and 74. Note that the filter's frequency response has been shifted over so that the approximate center frequency of the pass band corresponds to the upper end of the tracking band 470 MHz with an attenuation of −4.151 dB. The unwanted receiver half-IF spurious signal corresponds to a frequency of approximately 532.6 MHz with an attenuation of −24.96 dB well over 15 dB below the filter output signal level. The receiver IF spurious signal at 595.25 MHz is attenuated about 40 dB below the filter output signal. The finite attenuation pole notch at 610 MHz shows −59.479 dB attenuation with the image spurious signal on the return (not shown) being attenuated about 50 dB below the filter output signal.

The example filter characteristics shown in FIGS. 4–6 illustrate a number of advantageous features of a tracking filter constructed in accordance with the present invention. First, the filter insertion loss is relatively small and constant throughout the tracking range as indicated in Table 1 below.

TABLE 1

| Received Frequency (MHz) | Insertion Loss (dB) |
|---|---|
| 403 | −4.008 |
| 436.5 | −3.522 |
| 470 | −4.151 |

Over the entire tracking band, the insertion loss is basically constant at 3.84 dB within a 0.5 dB tolerance. This value of 3.8 dB is particularly low at these RF frequencies of 403 MHz–470 MHz. As the control voltage $V_c$ goes through its full range, corresponding to the complete tracking frequency range, the actual insertion loss of the filter only varies by less than 1 dB. By keeping the insertion loss of each desired RF receive signal substantially constant over the entire tracking range, several major design and performance advantages occur. For example, the gain distribution of the receiver is simplified, the sensitivity of the receiver is the same regardless of which portion of the RF band the radio is operating. Both the noise figure and the signal-to-noise ratio also remain constant over the RF tracking band.

Another advantageous feature of the present invention is that both the filter stop band and pass band change with the variation of the control voltage $V_c$ to the variable capacitors. As can be seen in the example frequency response characteristics shown in FIGS. 4–6, both the center frequency of the pass band and the finite attenuation pole shift in frequency by changing the control voltage applied to all is three varactors 70, 72, and 74 without substantially changing the shape of the pass band or the stop band. As the center frequency shifts, the filter continues to attenuate the image spurious signal substantially, e.g., on the order of 50 dB or more below the output signal level, and also significantly attenuates any spurious signal at the half-IF (which may be within the tracking band), i.e., on the order of about 10 to 15 dB below the filter output level. The receiver IF spurious signal at $f_{RF}+f_{if}$ is attenuated as much as 40 or 50 dB as well.

The present invention employs a relatively large number of inductors, which is unusual at RF frequencies. The conventional approach to designing a bandpass filter at RF frequencies is to minimize the number of inductors used for a specific number of attenuation poles. This minimizes the problems with the low Q associated with inductors at RF frequencies and particularly at UHF frequencies, and with the mutual coupling between inductors in close proximity of each other at these frequencies. The low Q in an inductor produces resistance which causes filter attenuation/insertion loss, particularly in the passband, at RF frequencies. On the other hand, there is negligible mutual coupling between capacitors in close proximity of each other at these frequencies. As a result, typical RF filter designs usually have more capacitors than inductors.

In contrast, the filter in accordance with the present invention employs more inductors than capacitors. In the example embodiment shown in FIGS. 2 and 3, the tracking filter employs three capacitors and twice as many (six) inductors. Significantly, despite the large number of inductors, the filter insertion loss is quite good and remains relatively constant over the entire tracking range as a result of careful determination of filter bandwidth, layout of the inductors to produce minimum effects of mutual coupling between inductors, positioning of the finite attenuation pole relative to the passband, and use of standard values of the inductors and capacitors. The intermodulation (IM) performance of this tracking filter is comparable to a normal passive filter because there are no nonlinear devices in the series arms of the filter.

Accordingly, the present invention provides excellent tracking filtering over a relatively wide RF frequency band using only a single, relatively small, inexpensive, and passive filter. While the present invention may be advantageously employed in the radio receiver described above, those skilled in the art will appreciate that it is only one example application. For example, the tracking filter is not limited to a particular frequency range or a particular type of receiver.

The invention has been described in terms of specific embodiments to facilitate understanding. The above embodiments, however, are illustrative rather than limitive. It will be apparent to one of ordinary skill in the art that departures may be made from the specific embodiments shown above without departing from the essential spirit and scope of the invention. For example, the present invention could be applied to attenuate unwanted signals generated by a synthesizer before the synthesizer signal is provided to a mixer. Therefore, the invention should not be regarded as being limited to the above examples, but should be regarded instead as being fully commensurate in scope with the following claims.

What is claimed is:

1. A passive, lumped, ultrahigh frequency (UHF) bandpass tracking filter that tracks a frequency of an input signal received in an UHF tracking range of frequencies, the bandpass filter including an input port receiving the input signal and an output port providing a filtered signal, comprising:

plural parallel inductor and capacitor circuits connected in shunt between the input port and the output port, each circuit including a capacitor connected to an inductor, and a control signal port receiving a tracking control signal that changes the capacitance of one or more of the connected capacitors in the parallel inductor and capacitor circuits to shift both a center frequency of the pass band of the filter and a high side, finite attenuation pole of the filter as the filter tracks the UHF input signal.

2. The bandpass tracking filter in claim 1, wherein the UHF tracking frequency range is about 403 MHz to 470 MHz.

3. The bandpass tracking filter in claim 1 receiving a radio frequency input signal and used in a radio receiver that includes:
 a local oscillator (LO) providing a range of LO frequencies, and
 a mixer mixing an LO signal generated by the LO with the input signal and generating an intermediate frequency (IF) signal as well as spurious signals, and
 wherein the filter substantially attenuates spurious signals at frequencies inside and outside the tracking frequency range.

4. The bandpass tracking filter in claim 3, wherein the spurious signals include a first spurious signal corresponding to the received RF input signal frequency plus twice the IF, a second spurious signal corresponding to the received RF input signal plus one-half of the IF, and a third spurious signal corresponding to the received RF input signal plus the IF.

5. The bandpass tracking filter in claim 3, wherein the substantial attenuation of the first spurious signal is about 50 dB below the level of a desired receive signal at the output of the filter.

6. The bandpass tracking filter in claim 3, wherein the attenuation of the second spurious signal is about 10 dB below the level of a desired receive signal at the output of the filter.

7. The bandpass tracking filter in claim 3, wherein the attenuation of the third spurious signal is about 40 dB below the level of a desired receive signal at the output of the filter.

8. The bandpass tracking filter in claim 1, wherein the bandpass tracking filter has over the UHF tracking frequency range both a low insertion loss of about 5 dB or less and a substantial constant insertion loss variance of about 1 dB or less.

9. The bandpass tracking filter in claim 1, wherein the parallel inductor and capacitor circuits include first, second, and third parallel inductor and capacitor circuits, the bandpass tracking filter further comprising:
 a first series inductor connecting the first and second parallel inductor and capacitor circuits, and
 a second series inductor connecting the second and third parallel inductor and capacitor circuits, and
 another inductor connected in series with a capacitor in one of the parallel inductor and capacitor circuits.

10. The bandpass tracking filter in claim 1, wherein the control signal changes the capacitance of the capacitors in all of the parallel inductor and capacitor circuits by the same amount.

11. The bandpass tracking filter in claim 1, wherein the control signal changes the capacitance of capacitors in different ones of the parallel inductor and capacitor circuits by different amounts.

12. A bandpass tracking filter that tracks a frequency of an input signal received in a radio frequency (RF) tracking range of frequencies, the bandpass filter including an input port receiving the input signal and an output port providing a filtered signal, comprising:

plural parallel inductor and capacitor circuits shunt-connected between the input port and the output port; and
 a control signal port providing a tracking control signal to change the capacitance of capacitors in the parallel inductor and capacitor circuits thereby shifting the pass band of the filter so the filter tracks the input signal,
 wherein the bandpass tracking filter has over the RF tracking frequency both a low insertion loss of about 5 dB or less and a substantially constant insertion loss variance of about 1.0 dB or less.

13. The bandpass tracking filter in claim 12, wherein the tracking frequency range is about 403 MHz to 470 MHz.

14. The bandpass tracking filter in claim 12 receiving a radio frequency (RF) input signal and used in a radio receiver including:
 a local oscillator (LO) providing a range of LO frequencies, and
 a mixer mixing an LO signal generated by the LO with the RF input signal and generating an intermediate frequency (IF) signal as well as other mixer products, and
 wherein the filter substantially attenuates a first mixer product outside the tracking frequency range and also attenuates a second mixer product within the tracking frequency range.

15. The bandpass tracking filter in claim 14, wherein the substantial attenuation of the first mixer product at the received RF plus twice the IF is about 50 dB below the level of a desired receive signal at the output of the filter.

16. The bandpass tracking filter in claim 15, wherein the attenuation of second mixer product at the received RF plus twice the IF is about 10 dB below the level of a desired receive signal at the output of the filter.

17. The bandpass tracking filter in claim 16, wherein the control signal changes the capacitance of the capacitors in all of the parallel inductor and capacitor circuits by the same amount.

18. The bandpass tracking filter in claim 16, wherein the control signal changes the capacitance of capacitors in different ones of the parallel inductor and capacitor circuits by different amounts.

19. A passive, lumped bandpass tracking filter that tracks a frequency of an ultrahigh frequency (UHF) input signal received in a tracking band of UHF frequencies, the bandpass filter including an input port receiving the RF input signal and an output port providing a filtered UHF signal, comprising:
 a first total number of capacitors between the input port and the output port, at least some of the capacitors connected in shunt between the input port and the output port;
 a second total number of inductors between the input port and the output port, the second total number of inductors being greater than the first total number of capacitors, and each inductor being coupled to one or more of the capacitors; and
 a tracking control signal applied to the capacitors changing their capacitance and shifting a frequency profile of the filter as the filter tracks the UHF input signal.

20. The bandpass tracking filter in claim 19, wherein the frequency profile of the filter includes both a center frequency of the pass band of the filter and a finite attenuation pole greater than the center frequency.

21. The bandpass tracking filter in claim 19, wherein the first number is three and the second number is six.

22. The bandpass tracking filter in claim 19, wherein some of the inductors are connected in parallel with the capacitors to form parallel resonant circuits and others of the inductors are series-connected between the resonant circuits.

23. The bandpass tracking filter in claim 19, wherein the UHF tracking frequency range is about 403 MHz to 470 MHz.

24. The bandpass tracking filter in claim 19, wherein the radio receiver includes:
   a local oscillator (LO) providing a range of LO frequencies, and
   a mixer mixing an LO signal generated by the LO with the RF input signal and generating an intermediate frequency (IF) signal, and
   wherein the filter substantially attenuates spurious signals at frequencies outside and inside of the tracking frequency range.

25. The bandpass tracking filter in claim 23, wherein the spurious signals include a first spurious signal corresponding to the received RF input signal frequency plus twice the IF, a second spurious signal corresponding to the received RF input signal plus one-half of the IF, and a third spurious signal corresponding to the received RF input plus the IF..

26. The bandpass tracking filter in claim 24, wherein the substantial attenuation of the first spurious signal is about 50 dB below the level of a desired receive signal at the output of the filter.

27. The bandpass tracking filter in claim 24, wherein the attenuation of the second spurious signal is about 10 dB below the level of a desired receive signal at the output of the filter.

28. The bandpass tracking filter in claim 24, wherein the attenuation of the third spurious signal is about 40 dB below the level of a desired receive signal at the output of the filter.

29. The bandpass tracking filter in claim 19, wherein the bandpass tracking filter has over the predetermined RF frequency range both a relatively low insertion loss of about 5.0 dB or less and a substantially constant insertion loss of about 1 dB or less.

* * * * *